United States Patent
Komori et al.

(10) Patent No.: US 10,249,505 B2
(45) Date of Patent: Apr. 2, 2019

(54) METHOD FOR TREATING ETCHING SOLUTION

(71) Applicant: KURITA WATER INDUSTRIES LTD., Tokyo (JP)

(72) Inventors: Hideyuki Komori, Tokyo (JP); Nobuhiro Orita, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 164 days.

(21) Appl. No.: 14/961,028

(22) Filed: Dec. 7, 2015

(65) Prior Publication Data
US 2016/0086812 A1 Mar. 24, 2016

Related U.S. Application Data

(63) Continuation of application No. 13/138,659, filed as application No. PCT/JP2010/055357 on Mar. 26, 2010, now abandoned.

(30) Foreign Application Priority Data

Mar. 31, 2009 (JP) .................................. 2009-086345

(51) Int. Cl.
*H01L 21/306* (2006.01)
*B01D 61/02* (2006.01)
(Continued)

(52) U.S. Cl.
CPC ........ *H01L 21/30604* (2013.01); *B01D 61/12* (2013.01); *B01D 61/22* (2013.01);
(Continued)

(58) Field of Classification Search
None
See application file for complete search history.

(56) References Cited

U.S. PATENT DOCUMENTS 4,786,417 A * 11/1988 Miki .................. C02F 1/02
210/195.2
5,158,683 A * 10/1992 Lin .................... B01D 61/025
210/651

(Continued)

FOREIGN PATENT DOCUMENTS

EP 1826829 A2 * 8/2007 .......... H01L 31/075
JP 01042824 A * 2/1989
(Continued)

OTHER PUBLICATIONS

"Dow Liquid Separations: FILMTECH™ Reverse Osmosis Membranes—Technical Manual." Form No. 609-00071-0705, Jul. 2007. pp. 1-182. Source location: The Dow Chemical Company. http://www.dow.com/en-us/water-and-process-solutions. Accessed: Aug. 31, 2015.*

(Continued)

*Primary Examiner* — Jeffrie R Lund
*Assistant Examiner* — Stanislav Antolin
(74) *Attorney, Agent, or Firm* — Manabu Kanesaka (57) ABSTRACT

A method for treating an etching solution in order to circulate and reuse an etching solution used in etching treatment of silicon includes (1) selectively removing multivalent ions having a valence of two or more, or (2) removing multivalent ions having a valence of two or more, 20-50% of alkali metal ions having a valence of one relative to a total amount of the alkali metal ions, and hydroxide ions, through a membrane separation unit comprising a nanofiltration membrane. A permeated solution of the membrane separation unit is circulated to the etching bath.

20 Claims, 5 Drawing Sheets

(51) Int. Cl.
*B01D 61/12* (2006.01)
*B01D 61/14* (2006.01)
*B01D 61/22* (2006.01)
*B01D 61/58* (2006.01)
*C02F 1/52* (2006.01)
*C02F 103/34* (2006.01)
*C02F 11/12* (2006.01)
*C02F 1/66* (2006.01)

(52) U.S. Cl.
CPC ............ *B01D 61/58* (2013.01); *B01D 61/027* (2013.01); *B01D 61/145* (2013.01); *B01D 2311/06* (2013.01); *C02F 1/52* (2013.01); *C02F 1/66* (2013.01); *C02F 11/12* (2013.01); *C02F 2001/5218* (2013.01); *C02F 2103/346* (2013.01); *Y02W 10/37* (2015.05)

(56) References Cited

U.S. PATENT DOCUMENTS

| | | | | |
|---|---|---|---|---|
| 5,205,937 A * | 4/1993 | Bhave | ............... | B01D 17/085 210/651 |
| 5,476,591 A * | 12/1995 | Green | ............... | B01D 61/027 210/638 |
| 5,490,939 A * | 2/1996 | Gerigk | ............... | B01D 61/022 134/38 |
| 5,503,750 A * | 4/1996 | Russo, Jr. | ............... | C12M 47/10 210/259 |
| 5,607,592 A * | 3/1997 | Bernard | ............... | B01D 61/022 210/195.2 |
| 5,734,944 A * | 3/1998 | Seeley | ............... | B01D 61/145 210/651 |
| 6,099,748 A * | 8/2000 | Netsu | ............... | C09K 13/02 134/1.3 |
| 6,132,618 A * | 10/2000 | Bass | ............... | C01B 33/20 210/641 |
| 6,180,009 B1 * | 1/2001 | Gottwald | ............... | B01D 61/025 134/10 |
| 6,365,051 B1 * | 4/2002 | Bader | ............... | B01D 61/147 210/640 |
| 6,454,958 B1 * | 9/2002 | Loehr | ............... | C23F 1/46 134/10 |
| 6,725,119 B1 * | 4/2004 | Wake | ............... | H01L 21/02063 134/1.3 |
| 2002/0053402 A1 * | 5/2002 | Nakano | ............... | H01L 21/67086 156/345.18 |
| 2002/0125191 A1 * | 9/2002 | Mukhopadhyay | ... | B01D 61/022 210/652 |
| 2003/0141250 A1 * | 7/2003 | Kihara | ............... | B01D 61/022 210/652 |
| 2004/0072437 A1 * | 4/2004 | Iizuka | ............... | C09K 13/02 438/693 |
| 2004/0099602 A1 * | 5/2004 | Ogawa | ............... | B01D 63/063 210/641 |
| 2005/0023222 A1 * | 2/2005 | Baillie | ............... | B01D 61/04 210/651 |
| 2005/0061149 A1 * | 3/2005 | Nieuwenhuizen | ..... | B01D 53/56 95/196 |
| 2005/0247637 A1 * | 11/2005 | Sher | ............... | C02F 5/04 210/697 |
| 2006/0231491 A1 * | 10/2006 | Mukhopadhyay | ... | B01D 61/022 210/639 |
| 2007/0039885 A1 * | 2/2007 | Kurth | ............... | B01D 61/025 210/639 |
| 2007/0298618 A1 * | 12/2007 | Koyata | ............... | C09K 13/02 438/745 |
| 2008/0078722 A1 * | 4/2008 | Ando | ............... | B01D 61/04 210/651 |
| 2008/0128354 A1 * | 6/2008 | Lombardi | ............... | B01D 61/12 210/636 |
| 2010/0314318 A1 * | 12/2010 | Gartner | ............... | A01N 37/30 210/638 |
| 2011/0059618 A1 * | 3/2011 | Olefjord | ............... | B01D 61/12 210/636 |
| 2011/0065959 A1 * | 3/2011 | Bailey | ............... | C02F 5/04 210/697 |
| 2013/0248445 A1 * | 9/2013 | Wang | ............... | B01D 53/56 95/196 |

FOREIGN PATENT DOCUMENTS

| | | | | | |
|---|---|---|---|---|---|
| JP | 09219388 | A | * | 8/1997 | ........... H01L 21/304 |
| JP | 10326769 | A | * | 12/1998 | ........... H01L 21/304 |
| JP | 11233484 | A | * | 8/1999 | |
| JP | 2002057139 | A | * | 2/2002 | |
| JP | 2005169191 | A | * | 6/2005 | ............... C01D 1/34 |
| JP | 2006278409 | A | * | 10/2006 | ........... H01L 31/075 |
| JP | 2007258656 | A | * | 10/2007 | ........... H01L 31/075 |
| WO | WO-9952821 | A2 | * | 10/1999 | ............. C01B 33/20 |
| WO | WO 2008038740 | A1 | * | 4/2008 | ........... B01D 61/025 |
| WO | WO-2009029464 | A1 | * | 3/2009 | ........... H01L 31/075 |
| WO | WO-2009113874 | A2 | * | 9/2009 | ............... C25F 3/12 |
| WO | WO-2012040880 | A1 | * | 4/2012 | ........... B01D 61/022 |

OTHER PUBLICATIONS

"A Science Based Performance Comparison of On-line TOC Analyzers." Technical Bulletin: 300 00123 Rev A, Oct. 2008. pp. 1-17. Source location: GE Water & Process Technologies. http://www.gewater.com/. Accessed: Sep. 1, 2015.*

J. Eikenberg. "On the Problem of Silica Solubility at High pH." Nationale Genossenschaft fuer die Lagerung radioaktiver Abfaelle (NAGRA), Baden, Switzerland. 1990. Technical Report 90-36. pp. 1-54. (Year: 1990).*

J. D. Hylton et al. "Uniform Pyramid Formation on Alkaline-etched Polished Monocrystalline (100) Silicon Wafers." Prog. in Photovoltaics: Res. & Appl. (1996) pp. 435-438. (Year: 1996).*

Guide GG25. "Cost-Effective Membrane Technologies for Minimising Wastes and Effluents." Environmental Technology Best Practice Programme (ETBPP). 1997. UK Government. (Year: 1997).*

I. Tobias et al. "Chapter 7: Crystalline Silicon Solar Cells and Modules." pp. 255-306 in A. Luque et al. Eds. "Handbook of Photovoltaic Science and Engineering." John Wiley & Sons Ltd. 2003. (Year: 2003).*

B. Sopori. "Chapter 8: Thin-film Silicon Solar Cells." pp. 307-357 in A. Luque et al. Eds. "Handbook of Photovoltaic Science and Engineering." John Wiley & Sons Ltd. 2003. (Year: 2003).*

"Chapter 1: Introduction." in S. Judd et al. "Membranes for Industrial Wastewater Recovery and Re-Use." 2003. Elsevier Science Inc. pp. 1-12. (Year: 2003).*

"Chapter 2: Membrane Technology." in S. Judd et al. "Membranes for Industrial Wastewater Recovery and Re-Use." 2003. Elsevier Science Inc. pp. 13-74. (Year: 2003).*

"Chapter 3: Deep, Three-Dimensional Silicon Micromachining." in J.A. Dziuban. "Bonding in Microsystem Technology." Springer MICROELECTR, vol. 24. 2006. Springer, Netherlands. pp. 15-118. (Year: 2006).*

* cited by examiner

METHOD FOR TREATING ETCHING SOLUTION

RELATED APPLICATIONS

The present application is a continuation application of U.S. patent application Ser. No. 13/138,659 filed on Sep. 16, 2011, which is a national phase entry of International Application No. PCT/JP2010/055357 filed on Mar. 26, 2010, which claims priority from Japanese Application No. 2009-086345 filed on Mar. 31, 2009, the disclosure of which are incorporated herein by reference.

FIELD OF INVENTION

The present invention relates to a method for treating an etching solution, in particular, an etching solution preferable in the case of, for example, forming a texture surface by etching a surface of a crystalline silicon substrate.

BACKGROUND OF INVENTION

In a crystalline silicon substrate used for a solar cell substrate, the surface of the substrate is made to have a fine pyramidal texture in order to improve the power generation efficiency by increasing the optical path length of incident light. Such a substrate can be obtained by etching (texture etching), a surface of a silicon substrate with an etching solution which may be, for example, a mixture solution of an alkaline solution containing 0.05 to 2 mol/L of NaOH or KOH, and a surfactant whose primary ingredient is caprylic acid or lauric acid of 0.01 mol/L or higher (Patent Document 1). The etching solution needs to be highly alkaline (high pH) in order to raise the etching rate of silicon, and contains an organic substance such as caprylic acid or lauric acid so as to form a texture on the silicon surface. Such an organic substance may be 4-propyl benzoate (Patent Document 2) or isopropyl alcohol (IPA) (Patent Document 3).

As etching processes are repeatedly performed with an etching solution, the pH of the solution drops to a lower value, and concurrently the concentration of $SiO_2$ (silicic acid) in the etching solution and that of dopants such as phosphorus (P) and boron (B) which had been doped into silicon rise. The concentration of the organic additive such as caprylic acid also falls. Consequently, the etching rate decreases and the formation of a fine texture surface becomes difficult, and the etching solution needs to be replaced periodically.

In the apparatus for treating an etching solution described in Patent Document 3, a collecting tank to separate dopants such as phosphorus and boron dissolved in the etching solution from the etching solution by means of adsorption, precipitation or electrical collection is installed, end the etching solution is reused. However, the frequency at which replacement is conducted cannot be sufficiently reduced, and, because metal salts, porous substances and the like come into contact with the etching solution, impurities derived from the metal salts and porous substances may commingle with each other.

PRIOR ART DOCUMENTS

Patent Documents

Patent Document 1: Japanese Patent Publication 2002-57139 A
Patent Document 2: Japanese Patent Publication 2007-25865 A
Patent Document 3: Japanese Patent Publication 2006-278409 A

OBJECT OF INVENTION

The present invention is made in response to the aforementioned existing circumstances, and an object of the invention is to provide an apparatus and a method for treating etching solution where the frequency at which the etching solution is replaced can be reduced, and where mixing of impurities into the treated etching solution can be concurrently prevented.

Since the water temperature in the etching bath is around 80° C., water readily evaporates and the NaOH concentration rises, which makes concentration control significantly difficult. Another object of the present invention is to carry out concentration control in the etching bath with ease.

SUMMARY OF INVENTION

The first aspect of the apparatus for treating etching solution is an apparatus for treating an etching solution in order to circulate and reuse an etching solution used in performing etching treatment of silicon, which includes membrane separation means which performs membrane separation treatment on an etching solution supplied from an etching bath, and circulating means which circulates a permeated solution supplied from the membrane separation means to the etching bath.

In the second aspect of the apparatus for treating an etching solution, according to the first aspect, the membrane separation means is provided with a nanofiltration membrane which selectively removes multivalent ions having a valence of two or more.

In the third aspect of the apparatus for treating an etching solution, according to the first aspect, the membrane separation means is provided with a nanofiltration membrane which removes multivalent ions having a valence of two or more, alkali metal ions having a valence of one, and hydroxide ions.

In the fourth aspect of the apparatus for treating an etching solution, according to the second or third aspect, the nanofiltration membrane is resistant to an alkali solution, is resistant to a temperature of up to 70° C. and has a molecular weight cut off of 150 to 2000.

In the fifth aspect of the apparatus for treating an etching solution, according to any one of the second to fourth aspects, the membrane separation means is provided with an ultrafiltration membrane which is installed upstream of the nanofiltration membrane.

In the sixth aspect of the apparatus for treating an etching solution, according to any one of the first to fifth aspects, the apparatus for treating an etching solution is provided with concentration measuring means which measures the alkali concentration and the organic substance concentration in the permeated solution supplied from the membrane separation means, alkalinity adding means which adds alkalinity to the permeated solution depending on the alkali concentration in the permeated solution measured with the concentration measuring means and organic substance adding means which adds an organic substance to the permeated solution depending on the organic substance concentration in the permeated solution measured with the concentration measuring means.

In the seventh aspect of the apparatus for treating an etching solution, according to the sixth aspect, it is provided with dilution water adding means which adds dilution water to the permeated solution depending of the alkali concentration and/or the organic substance concentration.

In the eighth aspect of the apparatus for treating an etching solution, according to the sixth or seventh aspect, the electric conductivity, or the electric conductivity and Na ion concentration of the etching solution that has supplied from the etching bath or the permeated solution of the membrane separation means are measured, and then the alkalinity adding means or the organic substance adding means is controlled based upon the results of the measurement.

In the ninth aspect of the apparatus for treating an etching solution, according to any one of the sixth to eighth aspects, the apparatus for treating an etching solution is provided with signal output means which outputs membrane exchange signals based on the electric conductivities of the membrane separation means before and after transport or the alkali concentration of the permeated solution.

In the tenth aspect of the apparatus for treating an etching solution, according to any one of the first to ninth aspects, the apparatus for treating an etching solution is provided with at least one of solution temperature adjusting means selected from the group consisting of solution temperature adjusting means for adjusting the solution temperature ($T_1$) of the etching solution prior to passing through the membrane separation means, and solution temperature adjusting means for adjusting the solution temperature ($T_2$) of the permeated solution of the membrane separation means.

In the eleventh aspect of the apparatus for treating an etching solution, according to the tenth aspect, the apparatus is provided with a heat exchange unit which performs heat exchange between a solution returning from the membrane separation moans to the etching bath and a solution flowing out of the etching bath for the membrane separation means.

In the twelfth aspect of the method for treating an etching solution, according to any one of the first to eleventh aspects, the apparatus is used for treating an etching solution.

Advantageous Effects of the Invention

The apparatus and method for treating an etching solution of the present invention remove an etching solution containing silicon components and/or dopants eluted from silicon by a membrane separation treatment, and circulate the etching solution to the etching bath, which allows the etching solution so be used for a longer period of time than conventional art and reduces the exchange frequencies of the etching solution.

That is, with the present invention, silicate ions and dopant ions which affect the etching rate can be separated efficiently, so an etching solution can be used without having so replace it for a long time. Moreover, since the etching solution does not need to be replaced for a longer time than conventional art, the amount of acid used to neutralize a highly concentrated waste alkali solution can be reduced.

The membrane separation means may be provided with a nanofiltration membrane which selectively removes multivalent ions having a valence of two or mere. In this case, multivalent ions having a valence of two or more, for example, silicate ions (e.g., $SiO_3^{2-}$), in the etching solution may be selectively separated while keeping the alkalinity of the etching solution, so the processing time for the texturing process may be stabilized and reduced.

The membrane separation means may be provided with a nanofiltration membrane which removes multivalent ions having a valence of two or more, alkali metal ions having a valence of one, and hydroxide ions. In this case, the etching solution which does not permeate the membrane separation means is alkaline, so silicic acid is ionized and fouling of the nanofiltration membrane can be prevented.

That is, under a neutral condition, silicate ions solace and reduce flux of the nanofiltration membrane, but by keeping the etching solution which does nor permeate the membrane alkaline, solution of silicate ions can be prevented and thus fouling of the nanofiltration membrane can be prevented.

The membrane separation means may be provided with a nanofiltration membrane and an ultrafiltration membrane which is installed at an upstream side of the nanofiltration membrane. The etching solution may contain high molecular weight material produced by reactions of dopants, organic substances, silicate ions or the like. So, when the etching solution is directly supplied to the nanofiltration membrane, the high molecular weight material may deposit on the surface of the membrane and reduce the flux thereof. By installing the ultrafiltration membrane module at an upstream side of the nanofiltration membrane module for removing the high molecular weight material, fouling of the nanofiltration membrane can be prevented.

Alkaline and organic substances may be added to the permeated solution in accordance with the alkali concentration and organic substance concentration in the permeated solution of the membrane separation means. By this, the alkali concentration and organic substance concentration in the etching solution can be maintained at the same levels as those of an unused etching solution.

The relationships between the specific weight, refractive index and electric conductivity, and the NaOH concentration and silica concentration of the NF permeated solution in the etching solution are as follows.

(i) When the NaOH concentration in the NF permeated solution rises, the specific weight, the refractive index and the electric conductivity increase.

(ii) When the NaOH concentration in the NF permeated solution falls, the specific weight, the refractive index fall, and the electric conductivity decrease.

(iii) When the silica concentration in the NF permeated solution rises, the specific weight and the refractive index rise, but the electric conductivity falls.

(iv) When the NaOH concentration falls and the silica concentration rises in the NF permeated solution, the specific weight and refractive index either rise, or fall but to a lesser extent than the case in (ii). The electric conductivity fails.

Thus, despite the fall in the electric conductivity of the NF permeated solution, when the specific weight (or the refractive index) rises, or when the decrease in the measured specific weight (or the refractive index) is small relative to the decrease in the electric conductivity, then it may be possible that the rate at which silica is leaking from the NF membrane is increasing. Accordingly, in this case, it is preferred to:
  (a) give a warning (NF membrane replacement order), and/or;
  (b) after disposing of the whole solution without conducting membrane treatment, and replenishing with the same amount of fresh solution (see operation to be hereinafter described in Comparable Example 2) and then restart operation.

At least one of the solution temperature ($T_1$) of the etching solution to be supplied to the membrane separation means, and the solution temperature ($T_2$) of the permeated solution of the membrane separation means may be adjusted. This results in an improvement in the removal rate of bivalent silicate ions.

DESCRIPTION OF EMBODIMENTS

Hereinafter, embodiments of the present invention are described in detail with reference to the drawings.

Figure 1:
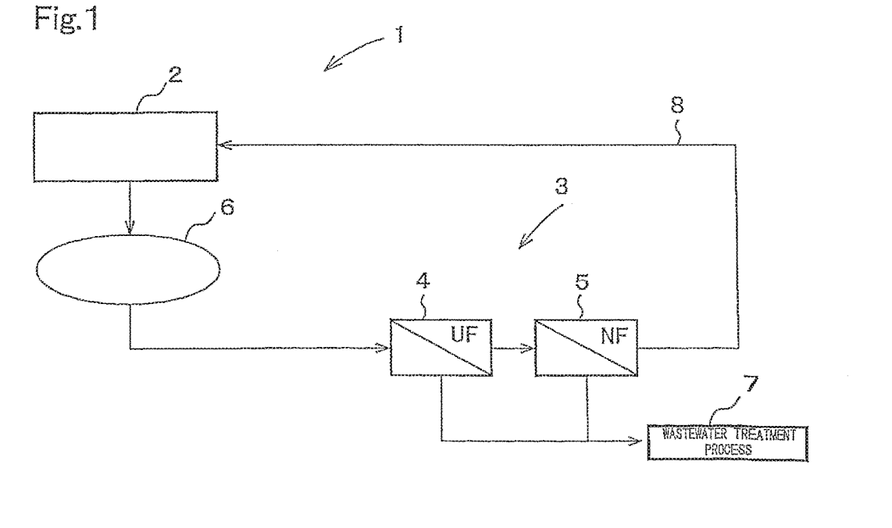
FIG. 1 is a flow diagram showing a framework of an apparatus for treating an etching solution according to an embodiment of the present invention.

FIG. 1 is a flow diagram of an etching apparatus provided with an apparatus 1 for treating an etching solution according to an embodiment of the present invention. An etching solution in an etching bath 2 is heated up to about 80 to 90° C. The etching solution in the etching bath 2 is circulated via circulating means 6, membrane separation means 3 and a return pipe 8.

The etching solution contains about 0.05 to 2 mol/L, particularly 1 to 1.5 mol/L, of NaOH, and 0.01 mol/L or more, for example, 0.1 to 0.2 mol/L of an organic additive. The organic additive may be a surfactant such as caprylic acid, lauric acid and 4-propyl benzoate as well as isopropyl alcohol and such.

Crystalline silicon wafers such as semiconductor wafers put in casings are dipped in the etching solution in the etching bath 2, and more than one silicon wafer is textured at a time. By the texturing treatment, silicon and dopants are eluted from the silicon wafers.

The etching solution in the etching bath 2 is supplied to the membrane separation means 3 by a pump installed in the circulating means 6. The membrane separation means 3 separates silicon compounds, dopant ions or the like from the etching solution. In the embodiment, it is provided with an ultrafiltration membrane (hereinafter may be referred to as a "UF membrane") module 4 and a nanofiltration membrane (hereinafter may be referred to as an "NF membrane") module 5. A permeated solution which has permeated the UF membrane module 4 and the NF membrane module 5 is returned to the etching bath 2 through the return pipe 8. A separated solution (a concentrated solution) from the etching solution which does not permeate each of the UF membrane and the NF membrane is sent to a wastewater treatment process 7 and is treated therein.

The UF membrane of the UF membrane module 4 has pores with larger membrane pore diameters than those of pores in the NF membrane. Fine particles in the solution, polymers formed by polymerized silicon components, and other polyion complexes such as dopants are removed by the UF membrane, which will reduce load on the NF membrane. However, the UF membrane is not essential and may be omitted in the present invention.

The UF membrane of the UF membrane module 4 preferably has pores with diameters from 2 to 100 nm and a molecular weight cut off of about 1,000 to 300,000. Preferred materials for the UF membrane are cellulose, acetate, polyacrylonitrile, polysulfone, polytetrafluoroethylene, polyether sulfone, polyvinylidene fluoride, and the like.

As is well known, an NF membrane has pores with diameters between those of a UF membrane and those of an RO membrane, and carries electric charges in the surface material. An NH membrane which can remove multivalent ions having at least valences of two or more is selected. The NH membrane may selectively remove multivalent ions having a valence of two or more, or it may remove multivalent ions having a valence of two or more, alkali metal ions having a valence of one, and hydroxide ions.

The NF membrane may remove multivalent ions having a valence of two or more, alkali metal ions having a valence of one, and hydroxide ions. The PP membrane preferably has a molecular weight cut off of about 150 to 2,000, particularly 200 to 1,000. When a target organic substance needs to permeate the NF membrane, an NF membrane having a molecular weight cut off greater than that of the organic substance may be selected.

In the case where an NF membrane which selectively removes multivalent ions having a valence of two or more is used, multivalent ions such as phosphoric acid are removed from the etching solution. In this case, the NF permeated solution is alkaline with a pH of about 13 to 14, and contains silicate ions having a valence of one, for example, $HSiO_3^-$. A part of silicon turns into bivalent ions (for example, $SiO_3^{2-}$) under highly alkaline conditions of a pH of 13 or higher. Accordingly, by making the etching solution pH 13 or higher, $SiO_3^{2-}$ and condensed bivalent silicate ions are removed from the etching solution.

In the case where an NF membrane which removes alkali metal ions having a valence of one, for example, sodium ions and potassium ions, and hydroxide ions is used, the separated solution turns alkaline, and silicon is ionized, so that fouling of the NF membrane can be curbed. When 20 to 50%, preferably 30 to 40% of alkali metal ions having a valence of one, and hydroxide ions can be removed, alkalinity of the etching solution can be sustained while preventing fouling of the NF membrane.

Figure 2:
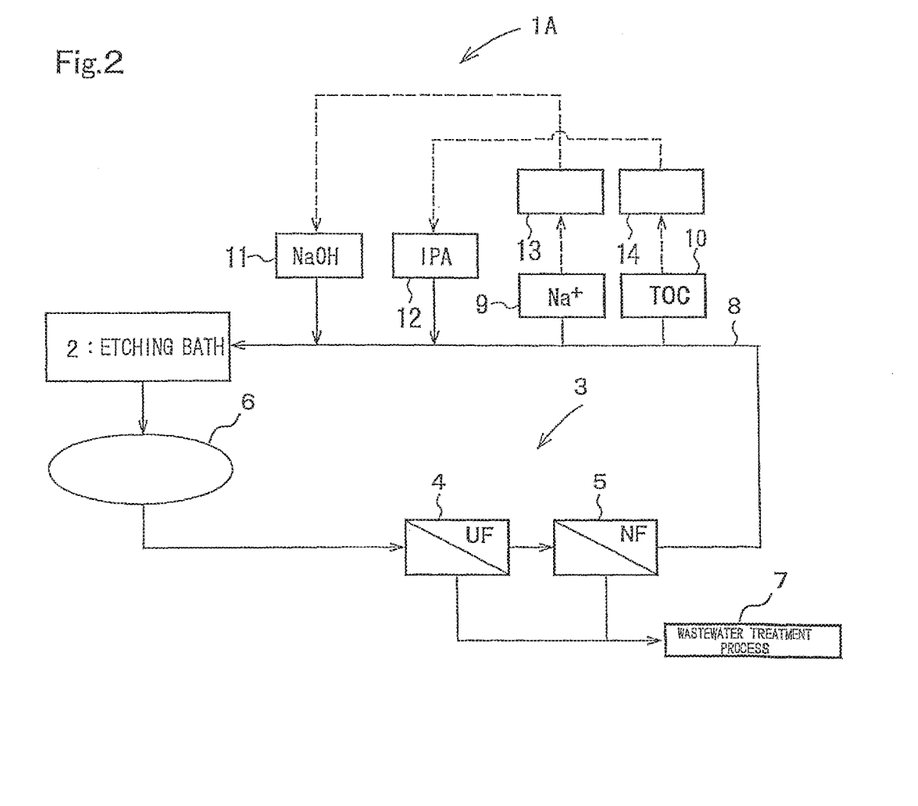
FIG. 2 is a flow diagram showing a framework of an apparatus for treating an etching solution according to an embodiment of the present invention.

An apparatus 1A for treating etching solution shown in FIG. 2 is provided, to the return pipe 8 according to the apparatus 1 for treating etching solution shown in FIG. 1, with alkali concentration measuring means 9 for the Na and the like in the permeated solution supplied from the membrane separation means 3, TOC concentration measuring means 10 which measures the concentrations of organic substances such as surfactant, IPA and the like therein, alkalinity adding means 11 which adds alkalinity to the permeated solution depending on the alkali concentration in the permeated solution measured by the alkali concentration measuring means 9 and organic substance adding means 12 which adds an organic substance to the permeated solution depending on the organic substance concentration in the permeated solution measured by the measuring means 10. Detection signals from the measuring means 9 and 10 are received by the respective control units 13 and 14, and the adding means 11 and 12 are controlled by the control units 13 and 14, respectively.

The alkali concentration may be measured using a refractive index, a viscosity meter, a pH meter, titration neutralization, and ultrasonic waves. The concentration of an organic additive may be measured using a TOC meter, infrared (TR) light, raman spectrometry, ultraviolet absorption, and visible light absorption.

The alkaline and organic additive added to the etching solution by the adding means 11 and 12 are the same alkaline and organic additive in the etching solution in the etching bath 2.

Figure 4:
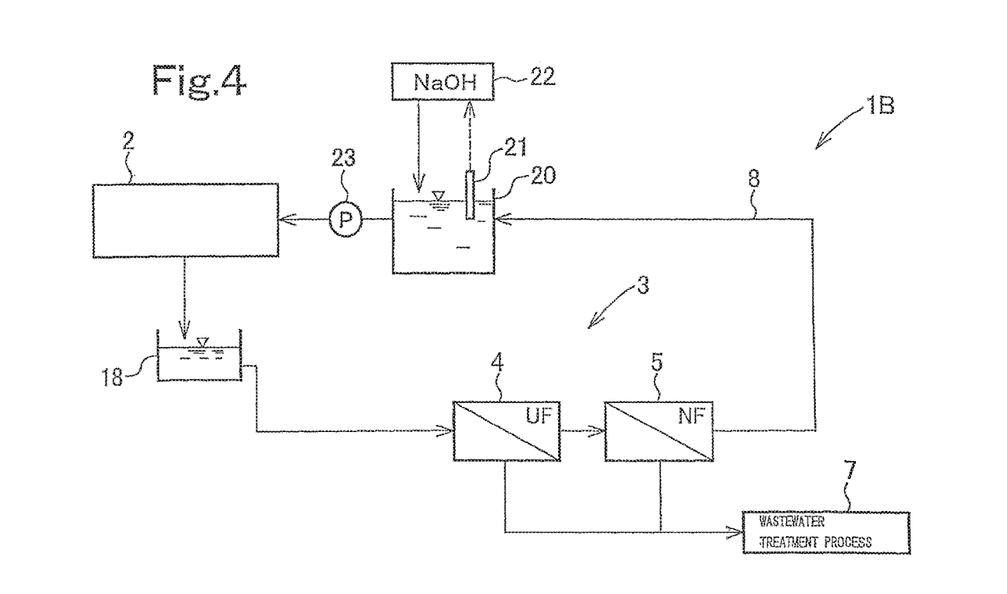
FIG. 4 is a flow diagram showing a framework of an apparatus for treating an etching solution according to an embodiment.

In an apparatus 1B for treating etching solution shown in FIG. 4, a solution returning to the etching bath 2 from the NF membrane module 5 is led into a NaOH concentration adjusting bath 20, and its NaOH concentration is detected by a NaOH concentration sensor 21. The detected NaOH concentration is transmitted to a NaOH adding unit 22, and a NaOH solution, for example, a 25% NaOH solution, is added to the returning solution so that its NaOH concentration in the adjusting bath 20 is equivalent to the NaOH concentration in the solution in the etching bath 2. The solution in the adjusting bath 20 is returned to the etching bath 2 by a pump 23.

The solution in the etching bath 2 is supplied to the UF membrane module 4 via an intermediary bath 18. Other components of the framework are the same as those in FIG. 1, and components having the same numbers denote the same components.

In the etching apparatuses shown in FIG. 1, FIG. 2 and FIG. 4, concentrated solution is discharged to the wastewater treatment process 7 from the membrane separation means. So, during operation, the etching bath 2 is replenished with a fresh etching solution so that the solution level in the etching bath 2 is kept at a constant level. The fresh etching solution is the same solution as the unused etching solution before starting the etching operation.

The treatment method in the wastewater treatment process 7 may be neutralization, coagulation sedimentation, crystallization, and drying using a drier. The concentrated solution supplied from the membrane modules 4 and 5 is strongly alkaline, so it needs to be neutralized. In an apparatus for treating etching solution of the present invention, silicon components and the like contained in a highly concentrated alkali solution are separated by a membrane treatment, and a permeated solution is returned to an etching bath. So, compared to the conventional example (see Comparable Examples 1 and 2 to be later described) which supplies all of an etching solution in an etching apparatus to a wastewater treatment process when the etching solution is contaminated, the amount of wastewater is reduced, and the load on the wastewater treatment process 7 can be mitigated, for example, the amount of acid necessary for neutralization in the wastewater treatment process can be reduced.

Figure 5:
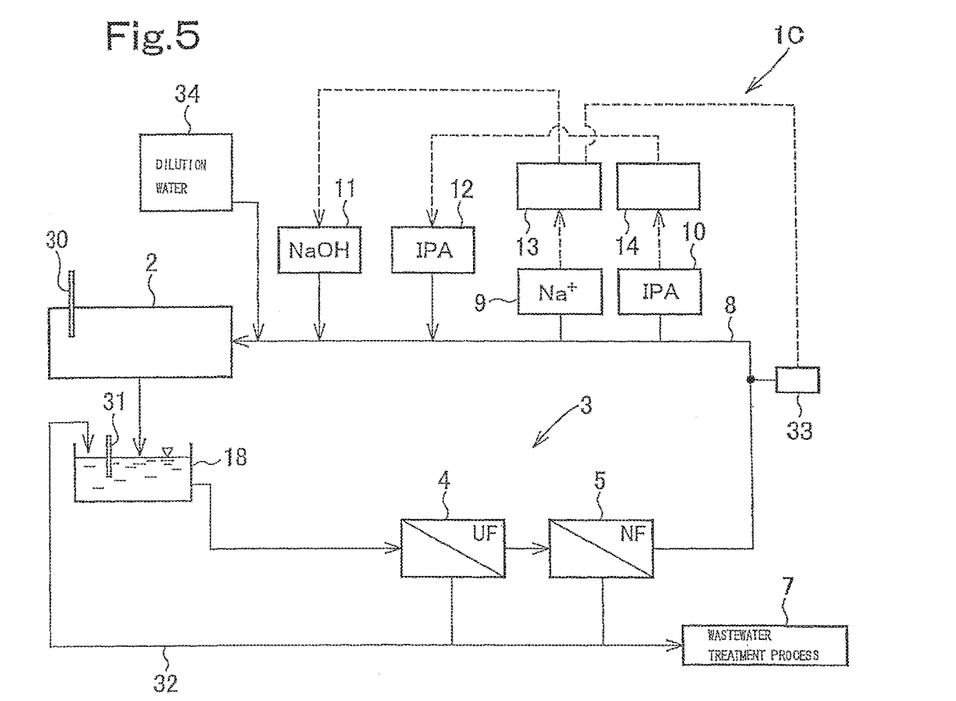
FIG. 5 is a flow diagram showing a framework of an apparatus for treating an etching solution according to an embodiment.

An apparatus 1C for treating etching solution shown in FIG. 5 is so constructed that the solution in the etching bath 2 is supplied to the UF membrane module 4 via the intermediary bath 18 in the apparatus 1A for treating etching solution shown in FIG. 2. The apparatus 1C for treating etching solution is further provided, to the return pipe 8, with an electric conductivity sensor 33 which measures the electric conductivity as an alkali concentration measuring means for Na and the like in the permeated solution supplied from the membrane separation means 3. A detection signal from the sensor 33 is received by the control unit 13. The control unit 13 controls the alkalinity adding means 11 depending on the detected values by the sensor 33 and the measured values obtained by the alkali concentration measuring means 9.

In FIG. 5, electric conductivity sensors 30 and 31 are also installed in the etching bath 2 and the intermediary bath 18, respectively. In FIG. 5, a dilution water adding unit 34, which adds dilution water to the solution returning to the etching bath 2, is installed. In FIG. 5, a pipe 32, which returns portion of the concentrated solution supplied from the UF membrane module 4 and the NF membrane module 5 to the intermediary bath 18, is installed. Other components in FIG. 5 are the same as those in FIG. 2, and components having the same numbers denote the same components.

In FIG. 5, the reason for measuring electric conductivity is as follows. Namely, when silicon dissolves in an alkali solution and silicate ion concentration rises, $OH^-$ ions are consumed and the pH drops. The molar electric conductivity of $OH^-$ ions at the time of infinite dilution is three to four times as high as that of other anions, so as the $OH^-$ ions are consumed, the electric conductivity falls. Thus, electric conductivity may be one of the indices representing silicic acid elements in an alkali solution.

When Na ion concentration in an alkali solution is known in advance, it is possible to calculate the presence or absence of silicate ions and their concentration in the solution merely from the electric conductivity of the solution. When Na ions can be detected by other means, the precision of the calculation can be enhanced.

The spot where the electric conductivity is measured is not particularly designated, yet the etching bath, intermediary bath or permeated is preferred. In the etching bath, as the silicate ion concentration rises, the $OH^-$ concentration drops and the electric conductivity decreases. Thus, it is preferred to control the electric conductivity at a constant value by supplying a new alkali solution and overflowing the etching solution. The waste etching solution that has overflowed is made to flow into the intermediary bath 18, and then is treated in the membrane separation means 3, and thus a purified alkali solution is obtained.

Figure 6:
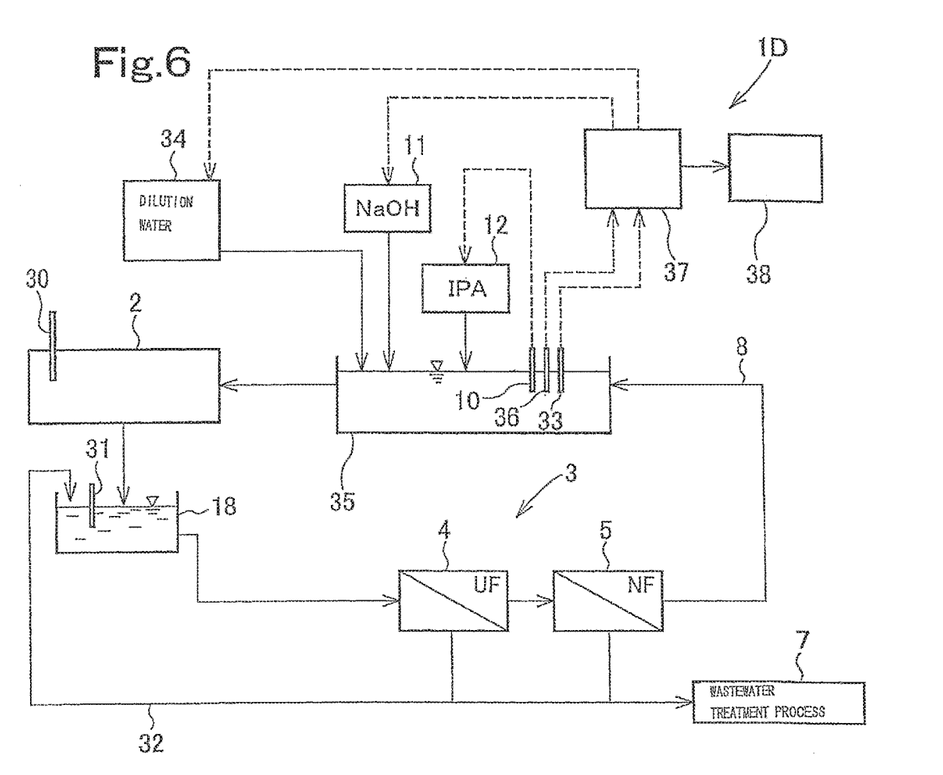
FIG. 6 is a flow diagram showing a framework of an apparatus for treating an etching solution according to an embodiment of the present invention.

As can be seen in FIG. 6 illustrated below, the operation pressure and operation ON/OFF of the membrane modules 4 and 5 may be appropriately controlled after calculating the alkali concentration and silicic acid concentration based on at least one of the detected results using a calculating unit (control unit 37).

In FIG. 5, sensors are installed in the return pipe 8 which connects the membrane separation means 3 and the etching bath 2, and IPA solution, NaOH solution and dilution water are added to the return pipe 8. Meanwhile, in an apparatus 1D for treating etching solution 1D shown in FIG. 6, an etching solution adjusting bath 35 is installed somewhere along the return pipe 8, sensors such as TOC concentration measuring means 10, an electric conductivity meter 33, a refractive index meter 36 are installed in the adjusting bath 35, and IPA solution, NaOH solution and dilution water are added to the adjusting bath 35. Detection signals of the electric conductivity meter 33 and the refractive index meter 36 are received by a control unit 37, and by the control unit 37 are controlled alkalinity aiding means 11 and a dilution water adding unit 34. When a measured value of the refractive index meter 36 exceeds a threshold, a warning generator 38 gives out an NF membrane replacing warning, and the whole etching solution supplied from an intermediary bath 18 is moved to a wastewater treatment process 7 without passing through the membrane separation means 3. Concurrently, dilution water supplied from the dilution water adding unit 34 and NaOH solution supplied from the alkalinity adding means 11 are supplied to the etching bath 2 via the adjusting bath 35. In this manner, even if SiO₂ leaks due to NF membrane deterioration, etching treatment can be carried out continuously.

The apparatus for treating etching solution of the present invention may be provided with at least one of solution temperature adjusting means for adjusting the solution temperature ($T_1$) of an etching solution supplied to the membrane separation means 3, and temperature adjusting means for adjusting the solution temperature ($T_2$) of the permeated solution of the membrane separation means 3. Particularly the apparatus may be provided with both of the solution temperature adjusting means for adjusting the solution temperature ($T_1$) of the etching solution supplied to the membrane separation means 3, and the solution temperature adjusting means for adjusting the solution temperature ($T_2$) of the permeated solution of the membrane separation means, whereby heat exchange is conducted between the two solution temperature adjusting means installed upstream and downstream sides of the membrane separation means 3. When the solution temperature ($T_1$) is adjusted by the solution temperature adjusting means, the removal rate of bivalent silicate ions is improved for the following reason.

The removal rate of bivalent silicate ions is attributed to the temperature dependency of the dissociation equilibrium constant of water, and can be described using formula (1) derived thermodynamically.

$$\left(\frac{\partial \ln K}{\partial T}\right)_p = \frac{\Delta_r H^\theta}{RT^2} \quad (1)$$

In formula (1), K represents the ion product of water, T represents the absolute temperature, R represents the gas constant and $\Delta_r H^0$ represents the standard enthalpy change of reaction. Suffix p in the left side term indicates equilibrium under constant pressure.

As is obvious from formula (1) above, a rise in temperature causes the ion product of water K to decrease, so the pH of the solution falls and dissociation of water becomes less likely to occur. That is, the existing amount of bivalent silicate ions to be removed becomes small. So, in order to improve the removal efficiency of bivalent silicate ions, treatment performed at a low temperature is preferred. On the other hand, when the temperature of the solution is significantly low, water flux of an NF membrane drops. So, there is a tradeoff between the amount of bivalent silicate ions and the water flux. Thus, it is preferred that temperature settings and the number of NF membranes be decided according to the composition of the etching solution and such.

Specifically, the solution temperature ($T_1$) of the etching solution supplied to the membrane separation means 3 is preferably 10 to 70° C., and particularly 30 to 50° C. When a solution having a solution temperature ($T_1$) of higher than 70° C. is treated by the membrane, the removal rate of bivalent silicate ions is reduced, and problems may occur in the membrane module. When a solution having a temperature of less than 10° C. is treated by the membrane, the membrane may consolidate depending on the operation pressure, and the water transport amount of the membrane may drop.

Figure 7:
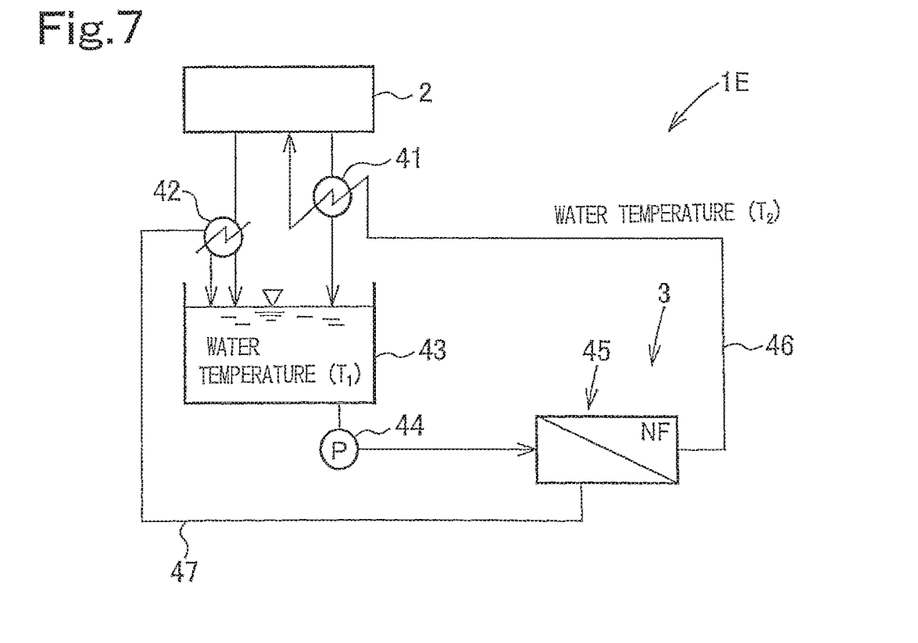
FIG. 7 is a flow diagram showing a framework of an apparatus for treating an etching solution according to an embodiment.

In an apparatus 1E for treating an etching solution shown in FIG. 7, the solution from the etching bath 2 is fed to an NF membrane module 45 of the membrane separation means 3 via an intermediary bath 43, and returns a permeated solution to the etching bath 2 through a pipe 46 via a heat exchange unit 41. The concentrated solution of the NF membrane module 45 is returned to the intermediary bath 43 through a pipe 47 via a heat exchange unit 42. The heat exchange unit 42 is solution temperature adjusting means to adjust the solution temperature ($T_1$) of the etching solution introduced into the intermediary bath 43, and the heat exchange unit 41 is solution temperature adjusting means to adjust the solution temperature ($T_1$) of the permeated solution of the membrane separation means 3. Only one of the heat exchange units 41 and 42 may be installed, yet at least the heat exchange unit 41 is preferably installed. It is preferred that heat exchange is conducted by the heat exchange unit 41 between the solution of about 80° C. supplied from the etching bath 2 and the permeated solution of the membrane separation means 3. When the solution temperature ($T_1$) is adjusted by such a heat exchange unit 41, membrane flux can be optimally adjusted.

The heat exchange unit 42 is for keeping the water temperature in the intermediary bath 43, and conducts heat exchange between the concentrated solution (for example, of 50° C. or less) of the NF membrane module, and the high temperature solution supplied from the etching bath 2.

When the molecular weight cut off of an NF membrane is relatively small, even if the temperature is high, the silica removal rate becomes high so that the temperature can be raised up to the tolerance level of the membrane and the flux can be set at its maximum. On the other hand, when the molecular weight cut off of an NF membrane is large, the silica removal rate drops as the solution temperature rises, so it is preferred to operate at a lower temperature. An NF membrane hawing a large molecular weight cut off has a relatively large flux, and the effects of operating at a low temperature is small.

In the illustrated embodiment, only one NF membrane module 5 is installed, yet more than one NF membrane module may be installed in a series. In this manner, the removal rate of silicic acid from the etching solution can be enhanced. For example, when only one NF membrane hawing silicic acid removal rate of 50% is installed, the silicic acid removal rate is 50%, but when two of the same NF membrane module are installed in series, 75% of silicic acid can be removed altogether.

EXAMPLES

The present invention is hereinafter described in greater detail with reference to examples and comparative examples, however the present invention is not limited to the following examples as long as it does not exceed its summary.

Comparative Example 1

Figure 3:
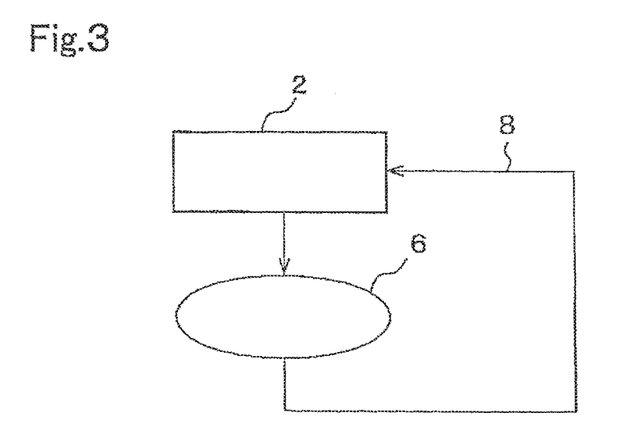
FIG. 3 is a flow diagram showing an example.

As is shown in FIG. 3, an apparatus for etching which simply circulates an etching solution in an etching bath 2 by circulating means 6 and a pipe 8 was used to conduct etching treatment of silicon wafers.

The volume of the etching bath 2 was 8 m², and to this bath was added unused etching solution comprising 54,600 mg/L NaOH solution and 11,700 mg/L IPA solution. The temperature of the etching solution was set at 85° C., and silicon wafers were dipped in the etching solution for about 30 minutes. Etching treatments were carried out continuously. To the etching bath 2 were timely replenished fresh etching solutions so that the solution level in the bath was kept at a constant level. By continuously conducting she etching treatments, silicon and dopants were eluted from the silicon wafers, and their concentrations in the etching solution gradually rose.

Approximately 500 silicon wafers were treated, and the composition of the resulting etching solution is shown in Table 1. Consequently, all of the etching solution in the system including the etching solution in the etching bath 2 and that in the return pipe 8 was replaced by a fresh etching solution, and the etching treatments were again repeated.

TABLE 1

| Composition of the Contaminated Etching solution | |
|---|---|
| $SiO_2$ | 22600 mg/L |
| $Na^+$ | 31400 mg/L |
| $PO_4^{3-}$ | 21 mg/L |
| TOC | 11710 mg/L |

In COMPARATIVE EXAMPLE 1, replacement of all of the etching solution had to be carried out at a frequency of twice a day (i.e., once every 12 hours) and the amount of waste solution reached 15 m³ a day.

Example 1

An apparatus shown in FIG. 1 was used as the apparatus for treating etching solution. The volume of the etching bath 2 was the same as that of COMPARATIVE EXAMPLE 1, and specifications and operation conditions of the UF membrane module 4 and NF membrane module 5 were as stated below.

UF Membrane Module 4: Nitto Denko Corp., "NTU-3306-K6R"

NF Membrane Module 5: NADIR Corp. (Germany), "NPO30"

Amount of Water Introduced to UF Membrane Module 4: 58 L/min

Solution temperature ($T_1$) of introduced solution (permeated solution of NF membrane module 5 and solution supplied through a Chiller (not illustrated in FIG. 1) after heat exchange treatment) to UF Membrane Module 4: 20° C.

Solution temperature ($T_2$) of returned solution (solution supplied from the circulation means 6 and solution supplied through a heater (not illustrated in FIG. 1) after heat exchange treatment) to etching bath 2: 80° C.

An etching solution in the etching bath 2 was the contaminated etching solution after being used in operation for 12 hours in COMPARATIVE EXAMPLE 1 above.

That is, in she above-described COMPARATIVE EXAMPLE 1, all of the contaminated etching solution as shown in Table 1 was disposed of, whereas in EXAMPLE 1, operation was continued while the contaminated etching solution was being treated by membrane separation.

Water recovery rates of the UF membrane module 4 and NF membrane module 5 were set at both 90%. Fresh etching solutions were timely replenished to the etching bath 2 so that the solution level in the etching bath 2 was kept at a constant level.

Composition of the permeated solution of the NF membrane 5 after 12 hours elapsed since the beginning of the operation of EXAMPLE 1 is shown in Table 2 below. For reference, the composition of the raw water of the Example 1 which is the waste solution shown in Table 1 is also described in Table 2.

Example 2

As the apparatus for treating etching solution, the apparatus as shown in FIG. 2 provided with alkaline (NaOH in the EXAMPLE) adding means and organic additive (IPA in the EXAMPLE) adding means was used. All other conditions for the etching treatment were the same as those in EXAMPLE 1.

As alkali concentration measuring means 9, a pH meter was used. A NaOH solution (24%) was added with a chemical feeding pump so that the $Na^+$ concentration after addition would be 31,400 mg/L.

As IPA concentration measuring means 10, a TOC meter was used. An IPA solution (20%) was added to the return pipe 8 with a chemical feeding pump so that the IPA concentration after addition would be 11,700 mg/L.

The composition of the etching solution (after 12 hours elapsed since the beginning of the operation) in the return pipe 8 downstream of the point where NaOH and IPA were added is shown in Table 2.

TABLE 2

| | Raw Water | EXAMPLE 1 (Removal Rate %) | EXAMPLE 2 |
|---|---|---|---|
| $SiO_2$ (mg/L) | 22600 | 9500 (58%) | 6500 |
| $Na^+$ (mg/L) | 31400 | 21200 (32%) | 31400 |
| $PO_4^{3-}$ (mg/L) | 21 | 9 (57%) | 9 |
| TOC (mg/L) | 11710 | 10260 (12%) | 11700 |

[Evaluation]

As is shown in Table 2, EXAMPLE 2 and EXAMPLE 2 had lower values of $SiO_2$ and $PO_4^{3-}$ concentrations in the permeated solution than those in the raw water, whereby etching treatment was continuously conducted without replacing all of the etching solution.

In EXAMPLE 1 and EXAMPLE 2, the amount of concentrated solution supplied from each of the membrane modules 4 and 5 to the waste etching solution treatment process was 8 m³ in sum total for a day. It was acknowledged that the amount of waste solution was significantly small compared to that in COMPARATIVE EXAMPLE 1.

Detailed evaluation of each EXAMPLE is as follows.

It is found that, in EXAMPLE 1, removal rates of $SiO_2$ and $PO_4^{3-}$, which are impurities, are high compared to that of $Na^+$. It is also found that, by combining a UF membrane module and an NF membrane module, a flow which separates $SiO_2$ and returns $Na^+$ to the etching bath can be formulated. It is further found that the TOC value which shows the organic additive concentration, and which is important in forming the texture on the surface of silicon, hardly changes in the course of a membrane separation treatment, so that the organic additive can be reused.

Moreover, it is found from the results of EXAMPLE 2 that, by installing concentration adjusting means, $SiO_2$ and $PO_4^{3-}$ can be separated, and concurrently concentrations of $Na^+$ and organic substances can be maintained, so that the etching performance could be further stabilized.

The $SiO_2$ concentration in the raw water is high, so when it is continuously used without conducting membrane separation treatment, the etching rare of the silicon wafer drops, and the desired texture formation becomes difficult to obtain. Thus, it is necessary to discharge the raw water before the $SiO_2$ concentration reaches about 20,000 to 25,000 mg/L, and to replace the etching solution.

On the other hand, when the UF membrane module and the NF membrane module are combined as shown in EXAMPLE 1 and EXAMPLE 2 above, it is possible to separate $SiO_2$ and $PO_4^{3-}$ and to return most of the $Na^+$ to the etching bath 2, so the amount of NaOH used can be reduced by half. In this manner, the life-span of an etching solution can be doubled, and the amount of acid used for neutralization can be curtailed because the amount of NaOH discharged to the wastewater treatment process can be reduced by half.

Comparative Example 2

Figure 8:
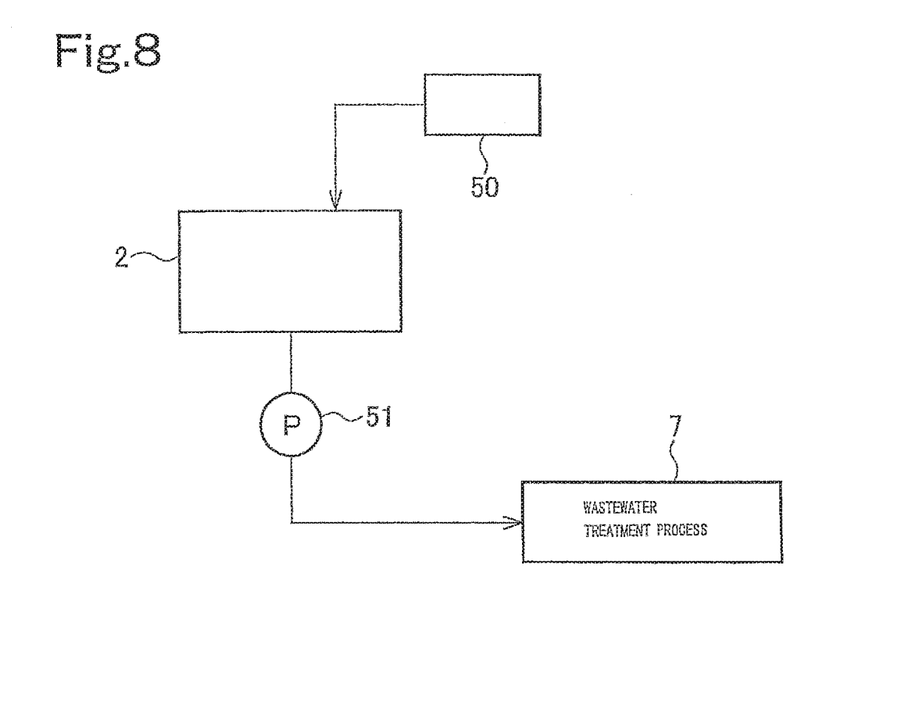
FIG. 8 is a flow diagram showing an example.

Etching treatment of silicon wafers using an etching apparatus shown in FIG. 8 was conducted. The volume of the etching bath 2 was 200 L, and to this bath was added an unused etching solution comprising 40,000 mg/L NaOH solution and 12,000 mg/L IPA solution. The temperature of the etching solution was set at 85° C., and silicon wafers were dipped in the etching solution for about 30 minutes. Etching treatments were carried out continuously. To the etching bath 2 was continuously added from the adding means 50 fresh etching solution in at a rate of 30 L/h so that the $SiO_2$ concentration in the etching solution in the etching bath 2 mould be about 20,000 mg/L. By continuously conducting the etching treatments, silicon and dopants mere eluted, and their concentrations in the etching solution gradually rose.

Approximately 500 silicon wafers were treated, and the composition of the resulting etching solution was as shown in Table 3. Consequently, all of the etching solution in the system was replaced by a fresh etching solution, and the etching treatments were again repeated.

TABLE 3

| | |
|---|---|
| $SiO_2$ | 22,000 mg/L |
| NaOH | 39,500 mg/L |
| $PO_4^{3-}$ | 22 mg/L |
| IPA | 11,500 mg/L |

In COMPARATIVE EXAMPLE 2, the replacement of all of the etching solution had to be carried out twice a day (i.e., once every 12 hours) and the amount of waste solution reached 400 L a day. This was an amount of waste solution for one etching bath, so in a mass production plant where the number of etching baths would be large, the amount of waste solution could pile up.

Comparative Example 3

In COMPARABLE EXAMPLE 2 above, as the $SiO_2$ concentration rose, the etching rate dropped. In COMPARATIVE EXAMPLE 3, a new NaOH solution (40,000 mg/L) was constantly added at a rate of 60 L/h so that the $SiO_2$ concentration was kept at about 10,000 mg/L in order to maintain a consistent etching rate.

As a result, the etching rate was kept stable compared to COMPARABLE EXAMPLE 1, but the amount of waste solution produced for a day was 820 L which was about twice as ranch as that of COMPARABLE EXAMPLE 2, and the waste solution disposal cost was doubled.

Example 4

The apparatus shown in FIG. 4 was used for treating etching solution. The volume of the etching bath 2 was the same as that of COMPARATIVE EXAMPLE 2, and specifications and operation conditions of the UF membrane module 4 and NF membrane module 5 are stated below. EXAMPLE 4 shows a result of a once-through treatment where the concentrated solution supplied from the membrane separation means 3 was not returned to the intermediary bath 18.

UF Membrane Module 4: Nitto Denko Corp., "NTU-3306-K6R"

NF Membrane Module 5: 2 8-inch NF Membrane of Molecular Weight Cut Off 300 installed in a Series Amount of water introduced to UF Membrane Module 4: 10 L/min Meter introduced to UF membrane module 4 was heat-exchanged with the permeated solution of NF membrane module 5 and than passed through a chiller (not illustrated in FIG. 4), and had a temperature of 50° C.

The returning water to the etching bath 2 was heat-exchanged with the solution from the intermediary bath 18 and then heated by a heater (not illustrated in FIG. 4), and had a temperature of 80° C.

The solution temperature in the intermediary bath 18 was 50° C.

Held in the etching bath 2 was the etching solution which was in a state of being used for operation for 12 hours in COMPARATIVE EXAMPLE 2 above. The solution in the bath 2 in this state was started to be treated.

That is, in COMPARATIVE EXAMPLE 2, all of the contaminated etching solution as shown in Table 3 was disposed of, whereas in EXAMPLE 4, operation was continued while the contaminated etching solution, was being treated by membrane separation.

The water recovery rate of the UF membrane module 4 was set at 90%, that of NF membrane module 5 was set at 50%, and that when the membrane modules were combined was 45%. To the etching bath 2 were timely replenished fresh etching solutions so that the solution level in the etching bath 2 was kept at a constant level.

Composition of permeated solution of the NF membrane 5 after 12 hours elapsed since the beginning of the operation of EXAMPLE 4 is shown in Table 1 below. For reference, the composition of the waste solution of COMPARABLE EXAMPLE 2 shown in Table 3 is entered under the column of waste etching solution raw water composition in Table 4. As is shown in Table 4, the removal rate of $SiO_2$ was 90%, whereas the recovery rate of NaOH was 60%, and NaOH was selectively recovered.

TABLE 4

| | Waste Etching Solution Raw Water (COMPARATIVE EXAMPLE 2) | EXAMPLE 4: Composition of Transported Solution (Figures in Parenthesis Represent Removal Rates) | EXAMPLE 5: Solution Concentration Etching Bath |
|---|---|---|---|
| $SiO_2$ (mg/L) | 22,000 | 1,900 (90%) | 9,500 |
| NaOH (mg/L) | 39,500 | 23,700 (40%) | 40,000 |
| $PO_4^{3-}$ (mg/L) | 22 | 9 (60%) | 12 |
| IPA (mg/L) | 11,500 | 10,500 (9%) | 12,000 |
| Water Recovery Rate | | 45% | 72% |
| Chemical Replacement Frequency | Once Every 12 Hours | Once Every 48 Hours or Less | Once Every 120 Hours or Less |
| Waste Solution (When Amount in COMPARATIVE EXAMPLE 2 was 1) | 1 | 0.55 | 0.2 |

Example 5

An etching solution was treated with the apparatus shown in FIG. 6. In EXAMPLE 5, by returning and circulating the concentrated solution of the UF membrane module 5, the water recovery rate was increased to 72% (water recovery rate of UF membrane module was 90%, and that of NF membrane module was 80%). The concentrated solution of the NF membrane module 5 was circulated to the intermediary bath, so the permeated solution having a further enhanced NaOH concentration was obtained. The brine of the UF membrane module was sent to the wastewater treatment process 7. Composition of the solution in the etching bath in EXAMPLE 5 is shown in Table 5.

The apparatus for treating an etching solution has NaOH adding means and an IPA, as an organic additive, adding means at the etching solution adjusting tank as shown in FIG. 6.

A NaOH solution (25 weight %) was added by adding means 11 composed of a chemical feeding pump so that the NaOH concentration in the bath 35 was 40,000 mg/L based on values detected by alkali concentration measuring means composed of a refractive index meter 36 and an electric conductivity meter (electromagnetic concentration meter (manufactured by Toa DKK)) 33.

A certain amount of dilution water was added to the etching solution adjusting bath 35 by a dilution water adding unit 34 so that the $SiO_2$ concentration in the etching bath 2 was 10,000 mg/L, and portion of the solution in the etching bath 2 was made to overflowed (not illustrated in FIG. 6, but the overflowed solution directly flowed from the etching bath to the wastewater treatment process). At this point, the amount of NaOH solution (25%) added by the chemical feeding pump was increased so that the NaOH concentration was 40,000 mg/L at the time the added dilution water was mixed. The permeated solution of the NF membrane module 5 was adjusted by adding NaOH and IPA, which were not sufficiently contained because 90% or more of the $SiO_2$ concentration was removed, to the etching solution adjusting bath 35.

The $SiO_2$ concentration in the etching solution adjusting bath 35 was kept at a few level due to the removal of $SiOH_2$ by the NF membrane. However, when the measured value of the refractive index meter 36 exceeded a threshold, the warning generating unit 38 was activated upon receiving a signal from the control unit 17 and gave out an NF membrane replacement order. Concurrently, the etching solution supplied from the intermediary bath 18 was not treated by the UF membrane module 4, but all was supplied to a pipe (not illustrated) leading to the wastewater treatment process. Concurrently, operation was switched to an operation of adding a fixed amount of dilution water and 25% NaOH solution upon reception of a signal from the control unit 17. In this manner, etching treatment could be continuously carried out even when $SiO_2$ leaked due to NF membrane deterioration.

Based on a detection signal of TOC concentration measuring means 10, an IPA solution (20%) was added by adding means 12 composed of a chemical feeding pump to the etching solution adjusting path 35 so that the IPA concentration was 12,000 mg/L.

The composition of the etching solution which was sampled (at a time 12 hours after the beginning of operation) from the return pipe 8 upstream of the etching solution adjusting bath 35 is shown in Table 5.

TABLE 5

Composition of Solution of EXAMPLE 5

| | Composition of Solution of the Intermediary Bath 18 | Composition of Permeated of NF Membrane Module (Figure in Parenthesis Represent Removal Rates) | Concentration of Solution in Etching Bath 2 |
|---|---|---|---|
| $SiO_2$ (mg/L) | 34,000 | 2,900 (92%) | 9,500 |
| NaOH (mg/L) | 56,000 | 33,700 (40%) | 40,000 |
| $PO_4^{3-}$ (mg/L) | 30 | 9 (60%) | 12 |
| IPA (mg/L) | 12,500 | 10,500 (9%) | 12,000 |

The present invention has been described in detail with reference to specific embodiments, and it is obvious to a person skilled in the art that various alterations are possible without deviating from the purpose and scope of the present invention.

The present application is based on a Japanese Patent Application Publication No. 2009-086345 filed as of Mar. 31, 2009, and the entire contents of which are incorporated herein by reference.

The invention claimed is:

1. A method for treating an etching solution in order to circulate and reuse an etching solution used in etching treatment of silicon, comprising:
   supplying an unused etching solution containing NaOH to an etching bath;
   dipping a silicon wafer in the unused etching solution in the etching bath, thereby producing the etching solution used in the etching treatment of silicon;
   selectively removing multivalent ions having a valence of two or more through a membrane separation unit comprising a nanofiltration membrane and an ultrafiltration membrane which is installed in an upstream side of the nanofiltration membrane, thereby performing membrane separation treatment on the etching solution supplied from the etching bath;
   circulating a permeated solution of the membrane separation unit to the etching bath;
   adding dilution water to the permeated solution in an etching solution adjusting bath, thereby producing the unused etching solution; and
   replenishing the unused etching solution from the etching solution adjusting bath to the etching bath so that a solution level of the unused etching solution is kept at a predetermined level,
   wherein the nanofiltration membrane removes at least silicate ions $SiO_3^{2-}$ and condensed silicic acid from the etching solution used in the etching treatment of silicon and obtains an alkaline etching solution.

2. The method according to claim 1, wherein the nanofiltration membrane is resistant to an alkali solution, is resistant to a temperature up to 70° C., and has a molecular weight cut off of 150 to 2000.

3. The method according to claim 1, wherein the unused etching solution further includes at least one of a surfactant and isopropyl alcohol.

4. The method according to claim 1, wherein the unused etching solution further contains organic substance.

5. The method according to claim 4, further comprising measuring a concentration of the NaOH and a concentration of the organic substance in the permeated solution supplied from the membrane separation unit;

adding NaOH to the permeated solution so that a concentration of Na ion in the NaOH in the permeated solution measured is kept at a predetermined value; and adding organic substance to the permeated solution so that the concentration of the organic substance in the permeated solution measured is kept at another predetermined value, wherein the unused etching solution contains 1-1.5 mol/L of NaOH and 0.1-0.2 mol/L of the organic substance.

6. The method according to claim 5, wherein the dilution water is added to the permeated solution depending on the concentration of the NaOH and/or the concentration of the organic substance measured.

7. The method according to claim 5, further comprising measuring an electric conductivity, or the electric conductivity and the concentration of Na ion of the etching solution supplied from the etching bath or the permeated solution of the membrane separation unit, and controlling an amount of the NaOH or the organic substance added based on the electric conductivity, or the electric conductivity and the concentration of Na ion measured.

8. The method according to claim 5, further comprising outputting membrane exchange signals based on electric conductivities of the membrane separation unit before and after the membrane separation treatment or the concentration of the NaOH of the permeated solution.

9. The method according to claim 1, further comprising measuring a refractive index in the unused etching solution by a refractive index meter, wherein the dilution water is added to the etching solution adjusting bath when the refractive index measured exceeds a predetermined threshold to adjust a concentration of $SiO_2$ in the etching solution adjusting bath.

10. The method according to claim 9, further comprising adding NaOH solution to the etching solution adjusting bath, wherein the concentration of the $SiO_2$ in the etching solution adjusting bath is adjusted to 10000 mg/L, and a concentration of the NaOH is adjusted to 40000 mg/L.

11. The method according to claim 9, further comprising generating a signal from a control unit when the refractive index measured exceeds the predetermined threshold, thereby activating a warning generating unit and issuing an order to replace the nanofiltration membrane, sending all the etching solution used to a wastewater treatment process by bypassing the nanofiltration membrane and the ultrafiltration membrane, and switching an operation to adding a predetermined amount of the dilution water and a predetermined amount of the NaOH solution to the etching solution adjusting bath based on the signal.

12. A method for treating an etching solution in order to circulate and reuse an etching solution used in etching treatment of silicon, comprising:

supplying an unused etching solution containing NaOH to an etching bath;

dipping a silicon wafer in the unused etching solution in the etching bath, thereby producing the etching solution used in the etching treatment of silicon;

selectively removing multivalent ions having a valence of two or more through a membrane separation unit comprising a nanofiltration membrane, thereby performing membrane separation treatment on the etching solution supplied from the etching bath;

circulating a permeated solution of the membrane separation unit to the etching bath;

adjusting a solution temperature (T1) of the etching solution supplied to the membrane separation unit to 10-70° C.;

adding dilution water to the permeated solution in an etching solution adjusting bath, thereby producing the unused etching solution; and replenishing the unused etching solution from the etching solution adjusting bath to the etching bath so that a solution level of the unused etching solution is kept at a predetermined level, wherein the nanofiltration membrane removes at least silicate ions $SiO_3^{2-}$ and condensed silicic acid from the etching solution used in the etching treatment of silicon and obtains an alkaline etching solution.

13. The method according to claim 12, further comprising performing heat exchange between a solution returning from the membrane separation unit to the etching bath and a solution flowing out of the etching bath for the membrane separation unit.

14. A method for treating an etching solution in order to circulate and reuse an etching solution used in etching treatment of silicon, comprising:

supplying an unused etching solution containing NaOH to an etching bath;

dipping a silicon wafer in the unused etching solution in the etching bath, thereby producing the etching solution used in the etching treatment of silicon;

selectively removing multivalent ions having a valence of two or more through a membrane separation unit comprising a nanofiltration membrane, thereby performing membrane separation treatment on the etching solution supplied from the etching bath;

circulating a permeated solution of the membrane separation unit to the etching bath;

adjusting a solution temperature (T2) from the permeated solution of the membrane separation unit to 80° C.;

adding dilution water to the permeated solution in an etching solution adjusting bath, thereby producing the unused etching solution; and replenishing the unused etching solution from the etching solution adjusting bath to the etching bath so that a solution level of the unused etching solution is kept at a predetermined level, wherein the nanofiltration membrane removes at least silicate ions $SiO_3^{2-}$ and condensed silicic acid from the etching solution used in the etching treatment of silicon and obtains an alkaline etching solution.

15. The method according to claim 14, further comprising performing heat exchange between a solution returning from the membrane separation unit to the etching bath and a solution flowing out of the etching bath for the membrane separation unit.

16. A method for treating an etching solution in order to circulate and reuse an etching solution used in etching treatment of silicon, comprising:

supplying an unused etching solution containing NaOH to an etching bath;

dipping a silicon wafer in the unused etching solution in the etching bath, thereby producing the etching solution used in the etching treatment of silicon;

removing multivalent ions having a valence of two or more, 20-50% of alkali metal ions having a valence of one relative to a total amount of the alkali metal ions, and hydroxide ions through a membrane separation unit comprising a nanofiltration membrane and an ultrafiltration membrane which is installed in an upstream side of the nanofiltration membrane, thereby performing membrane separation treatment on the etching solution supplied from the etching bath;

circulating a permeated solution of the membrane separation unit to the etching bath;

adding dilution water to the permeated solution in an etching solution adjusting bath, thereby producing the unused etching solution; and replenishing the unused etching solution from the etching solution adjusting bath to the etching bath so that a solution level of the unused etching solution is kept at a predetermined level, wherein the nanofiltration membrane removes at least silicate ions $SiO_3^{2-}$ and condensed silicic acid from the etching solution used in the etching treatment of silicon and obtains an alkaline etching solution.

17. The method according to claim 16, wherein the unused etching solution further includes at least one of a surfactant and isopropyl alcohol.

18. The method according to claim 16, further comprising measuring a refractive index in the unused etching solution by a refractive index meter, wherein the dilution water is added to the etching solution adjusting bath when the refractive index measured exceeds a predetermined threshold to adjust a concentration of $SiO_2$ in the etching solution adjusting bath.

19. The method according to claim 18, further comprising adding NaOH solution to the etching solution adjusting bath, wherein the concentration of the $SiO_2$ in the etching solution adjusting bath is adjusted to 10000 mg/L, and a concentration of the NaOH is adjusted to 40000 mg/L.

20. The method according to claim 18, further comprising generating a signal from a control unit when the refractive index measured exceeds the predetermined threshold, thereby activating a warning generating unit and issuing an order to replace the nanofiltration membrane, sending all the etching solution used to a wastewater treatment process by bypassing the nanofiltration membrane and the ultrafiltration membrane, and switching an operation to adding a predetermined amount of the dilution water and a predetermined amount of the NaOH solution to the etching solution adjusting bath based on the signal.

* * * * *